United States Patent
Chou

(10) Patent No.: US 7,940,571 B2
(45) Date of Patent: May 10, 2011

(54) MEMORY APPARATUS AND METHOD THEREOF FOR OPERATING MEMORY

(75) Inventor: Tsung-Yi Chou, Hsinchu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 58 days.

(21) Appl. No.: 12/393,326

(22) Filed: Feb. 26, 2009

(65) Prior Publication Data

US 2010/0214841 A1    Aug. 26, 2010

(51) Int. Cl.
*G11C 16/04*    (2006.01)
(52) U.S. Cl. .......... 365/185.24; 365/185.03; 365/185.18
(58) Field of Classification Search ............. 365/185.24, 365/185.03, 185.18
See application file for complete search history.

(56) References Cited

U.S. PATENT DOCUMENTS

| | | | |
|---|---|---|---|
| 6,937,511 B2 * | 8/2005 | Hsu et al. | 365/185.03 |
| 7,209,385 B1 * | 4/2007 | Wu et al. | 365/185.01 |
| 7,242,618 B2 | 7/2007 | Shappir et al. | |
| 7,723,778 B2 * | 5/2010 | Kuo | 257/324 |
| 2005/0162922 A1 * | 7/2005 | Hsu et al. | 365/185.28 |
| 2006/0146613 A1 * | 7/2006 | Lee et al. | 365/185.24 |
| 2006/0221692 A1 | 10/2006 | Chen | |
| 2007/0081390 A1 * | 4/2007 | Yeh et al. | 365/185.21 |
| 2008/0002464 A1 | 1/2008 | Maayan | |
| 2008/0025090 A1 | 1/2008 | Lee et al. | |
| 2008/0158984 A1 | 7/2008 | Mokhlesi | |
| 2008/0158985 A1 | 7/2008 | Mokhlesi | |
| 2008/0181014 A1 | 7/2008 | Lee | |
| 2008/0205141 A1 | 8/2008 | Lee et al. | |
| 2008/0225599 A1 | 9/2008 | Chae | |

* cited by examiner

*Primary Examiner* — Hoai V Ho
*Assistant Examiner* — Jay Radke
(74) *Attorney, Agent, or Firm* — J.C. Patents

(57) ABSTRACT

A memory apparatus and a method thereof for operating a memory are provided herein. The apparatus has the memory and a controller. The memory has a plurality of memory cells, and each the memory cells has a first side and the second side. Each of the first side and the second side is programmable to store one bit of data. The controller programs the first sides and the second sides of the memory cells to different levels. Several threshold voltage distributions of the programmed memory cells could be overlapped with each other. The controller distinguishes the bits of the memory cells by comparing the threshold voltages of the memory cells with the different levels and by comparing the threshold voltages with those of neighbor sides.

21 Claims, 6 Drawing Sheets

MEMORY APPARATUS AND METHOD THEREOF FOR OPERATING MEMORY

BACKGROUND OF THE INVENTION

1. Field of Invention

The present invention relates to a memory, and more specifically, to a memory apparatus and a method thereof for operating a memory.

2. Description of Related Art

A memory is a semiconductor device designed for storing information or data. As the functions of computer microprocessors become more and more powerful, programs and operations executed by software are increasing correspondingly. Consequentially, the demand for high storage capacity memories is getting more.

Among various types of memory products, a non-volatile memory allows multiple-time data programming, reading and erasing operations, and the data stored therein can be retained even after the power to the memory is terminated. With these advantages, the non-volatile memory has become one of the most widely adopted memories for personal computers and electronic equipment.

Electrically programmable and erasable non-volatile memory technologies based on charge storage structures known as Electrically Erasable Programmable Read-Only Memory (EEPROM) and flash memory are used in a variety of modern applications. A flash memory is designed with an array of memory cells that can be independently programmed and read. Conventional flash memory cells store charge on a floating gate. The stored charge changes the threshold voltage Vt of the memory cell. In a READ operation, a read voltage is applied to the gate of the memory cell, and whether or not the memory cell turns on (e.g. conducts current) indicates the programming state of the memory cell. For example, memory cell that conducts current during a READ operation might be assigned a digital value of "1", and a memory cell that does not conduct current during a READ operation might be assigned a digital value of "0". Charge is added to and removed from the floating gate to program and erase the memory cell, i.e., to change the stored value from "1" to "0" or from "0" to "1".

Another type of memory uses a charge-trapping structure, such as a layer of non-conductive SiN material, rather than the conductive gate material used in floating gate devices. When a charge-trapping cell is programmed, the charge is trapped and does not move through the non-conductive layer. The charge is retained by the charge trapping layer until the cell is erased, retaining the data state without continuously applied electrical power. Charge-trapping cells can be operated as two-sided cells. That is, because the charge does not move through the non-conductive charge trapping layer, charge can be localized on different charge-trapping sites.

With the amount of the memory cells grows higher, the threshold voltage distribution range of the memory cells therefore becomes very large. FIG. 1 and FIG. 2 are examples of threshold voltage distribution diagrams of a conventional 1-Megabite memory and a conventional 1-Gigabite memory respectively. Both of the memories have a plurality memory cells, each of which are capable of storing two bits of data. The horizontal axis represents the threshold voltage of a memory cell, and the vertical axis represents the amount of memory cells. The threshold voltage distribution of the 1-Megabyte memory includes distribution regions 21 to 24. SW1 is the sensing window between the high boundary of distribution region 21 and low boundary of distribution region 22. Similarly, SW2 is the sensing window between distribution regions 22 and 23. SW3 is the sensing window between distribution regions 23 and 24. Distribution regions 25 to 28 are threshold voltage distribution regions of the 1-Gigabyte memory. Sensing windows SW4 to SW6 are the sensing windows of the 1-Gigabyte memory. As shown in FIGS. 1-2, the ranges of distribution regions 25 to 28 are generally larger than the ranges of distribution regions 21 to 24, which causes sensing windows SW4 to SW6 of the 1-Gigabyte memory are much narrower than the sensing windows SW1 to SW3 of the 1-Megabyte memory. Thus, when the capacity of a memory grows higher, the diversity of the threshold voltages of the memory cells of the memory becomes larger, and the sensing windows of the memory become narrower, which causes difficulty to perform the sensing process for distinguishing states of memory cells of the memory when reading the memory.

SUMMARY OF THE INVENTION

Accordingly, an object of the present invention is to provide a method for operating a memory. After finishing programming a plurality of memory cells of the memory to different levels, bits of the memory cells could be distinguished by comparing the threshold voltages of the memory cells with the different levels A further object of the present invention is to provide a memory apparatus. The apparatus has a memory and a controller. The controller programs a plurality of memory cells of the memory to different level, and distinguishes bits of the memory cells by comparing the threshold voltages of the memory cells with the different levels.

The present invention provides a method for operating a memory. The memory comprises a plurality of memory cells. Each of the memory cells has a first side and a second side. The method comprises programming the first sides of a first group of the memory cells to be higher than a first level when the second sides of the first group of the memory cells should be in a low threshold voltage level; and programming the first sides and the second sides of a second group of the memory cells to be higher than a second level when the first sides and the second sides of the second group of the memory cells should be in a high threshold voltage level. The first level is less than the second level.

The present invention also provides a method for operating a memory. The memory comprising at least one memory cell. The memory cell has a first side and a second side. The method comprises determining whether a threshold voltage of the first side of the memory cell is higher than a first level; determining whether the threshold voltage of the first side of the memory cell is less than a second level; and comparing the threshold voltage of the first side with a threshold voltage of the second side when the threshold voltage of the first side is between the first level and the second level. The first level is less than the second level.

The present invention also provides a memory apparatus. The memory apparatus comprises a memory and a controller. The memory has a plurality of memory cells. Each of the memory cells has a first side and a second side. The controller applies at least following steps to program the memory cells: programming the first sides of a first group of the memory cells to be higher than a first level when the second sides of the first group of the memory cells should be in a low threshold voltage level; and programming the first sides and the second sides of a second group of the memory cells to be higher than a second level when the first sides and the second sides of the second group of the memory cells should be in a high threshold voltage level.

The present invention also provides a memory apparatus. The memory apparatus comprises a memory and a controller. The memory has at least one memory cell. The memory cell has a first side and a second side. The controller applies at least following steps to read the memory cell: determining whether a threshold voltage of the first side of the memory cell is higher than a first level; determining whether the threshold voltage of the first side of the memory cell is less than a second level, wherein the first level is less than the second level; and comparing the threshold voltage of the first side with a threshold voltage of the second side when the threshold voltage of the first side is between the first level and the second level.

In an embodiment of the present invention, the controller further applies following step to program the memory cells: stopping programming the first sides of the first group of the memory cells when threshold voltages of the second sides of the first group of the memory cells are higher than the first level.

In an embodiment of the present invention, the controller further applies following step to program the memory cells: programming the second sides of a third group of the memory cells to be higher than the first level when the first sides of the third group of the memory cells should be in the low threshold voltage level.

In an embodiment of the present invention, before programming the first sides and the second sides of the second group of the memory cells to be higher than the second level, the controller simultaneously programs the first sides and the second sides of the second group of the memory cells and the first sides of the first group of the memory cells to be higher than the first level.

In an embodiment of the present invention, the controller further applies following steps to program the memory cells: finding an upper bound of a first threshold voltage distribution of the memory; and defining the first level to be higher than the upper bound of the first distribution.

In an embodiment of the present invention, the controller further applies following steps to program the memory cells: finding an upper bound of a second threshold voltage distribution of the memory; and defining the second level to be higher than the upper bound of the second distribution. The upper bound of the second threshold voltage distribution is higher than the upper bound of the first threshold voltage distribution.

In an embodiment of the present invention, if the threshold voltage of the first side of the memory cell is less than then the first level, determining the first side to be a first logic state.

In an embodiment of the present invention, the controller further applies following step to read the memory cell: if the threshold voltage of the first side of the memory cell is higher than then the second level, determining the first side to be a second logic state.

In an embodiment of the present invention, the controller further applies following step to read the memory cell: if the threshold voltage of the first side is between the first level and the second level and if the threshold voltage of the first side is less than the threshold voltage of the second side, determining the first side to be a first logic state and the second side to be a second logic state.

In an embodiment of the present invention, the controller further applies following step to read the memory cell: if the threshold voltage of the first side is between the first level and the second level and if the threshold voltage of the first side is higher than the threshold voltage of the second side, determining the first side to be a second logic state and the second side to be a first logic state.

In order to make the aforementioned and other objects, features and advantages of the present invention comprehensible, several preferred embodiments accompanied with figures are described in detail below.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 3:
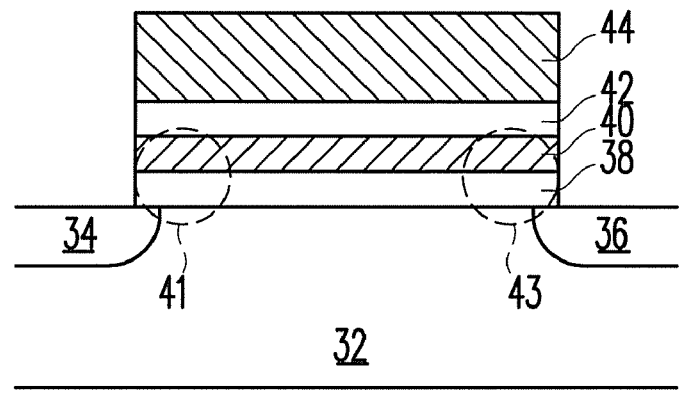
FIG. 3 is a sectional view of a memory cell according to the prior art.

Please refer to FIG. 3, which is a sectional view of a memory cell 30 according to the prior art. The memory cell 30 has a substrate 32 having two buried PN junctions. One of the PN junctions is between the source 34 and substrate 32, and the other of the PN junctions is between the drain 36 and the substrate 32. A bottom isolation layer 38 of the memory cell 30 is formed over the channel between the source 34 and the drain 36. On top of the electrical isolation layer 38 is a charge trapping layer 40, which is electrically isolated from the substrate 32 by the isolation layer 38. The hot electrons are trapped as they are injected into the charge trapping layer 40, such that the threshold voltage of the memory cell 30 would be adjusted under control. A top isolation layer 42 are formed over the charge trapping layer 40 to electrically isolate a conductive gate 44 from the charge trapping layer 40. The gate 44 is formed over the silicon dioxide layer 42. The memory cell 30 has a first side 41 near the source 34 and a second side 43 near the drain 36. Each of the first side 41 and the second side 43 is programmable to store one bit of data. Therefore, two bits of data could be stored in the memory cell 30.

When programming the first side 41, voltages are applied to the gate 44 and the source 34 such that vertical and lateral electrical fields are created to accelerate electrons from the drain 36 along the channel of the memory cell 30. As the electrons move along the channel, some of the electrons gain sufficient energy to jump over the potential barrier of the bottom isolation layer 38 and become trapped in the charge trapping layer 40 around the first side 41. Consequently, a threshold voltage of the first side 41 is increased, and the bit of the first side 41 is altered from "1" to "0", i.e. form a first logic state to a second logic state. Similarly, when programming the second side 43, voltages are applied to the gate 44 and the drain 36 to force electrons to be trapped in the charge trapping layer 40 around the second side 43. Therefore, a threshold voltage of the second side 43 would be increased, and the bit of the second side 43 is altered from "1" to "0".

Figure 4:
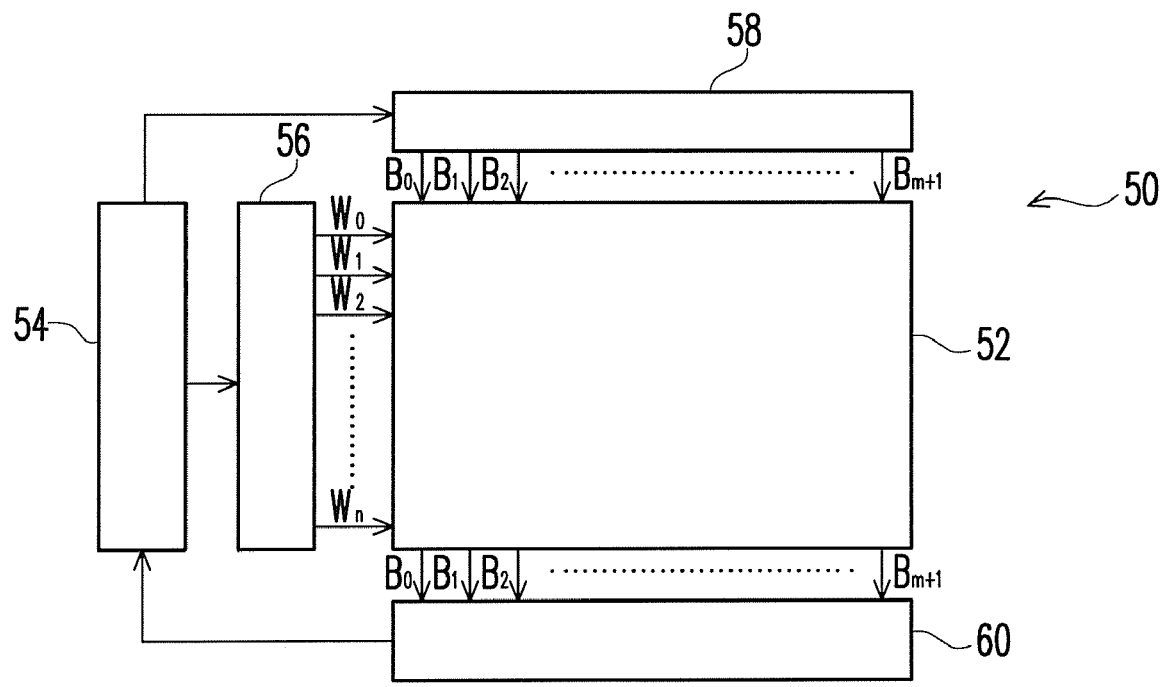
FIG. 4 is a functional block diagram of a memory apparatus according to an embodiment of the present invention.
Figure 5:
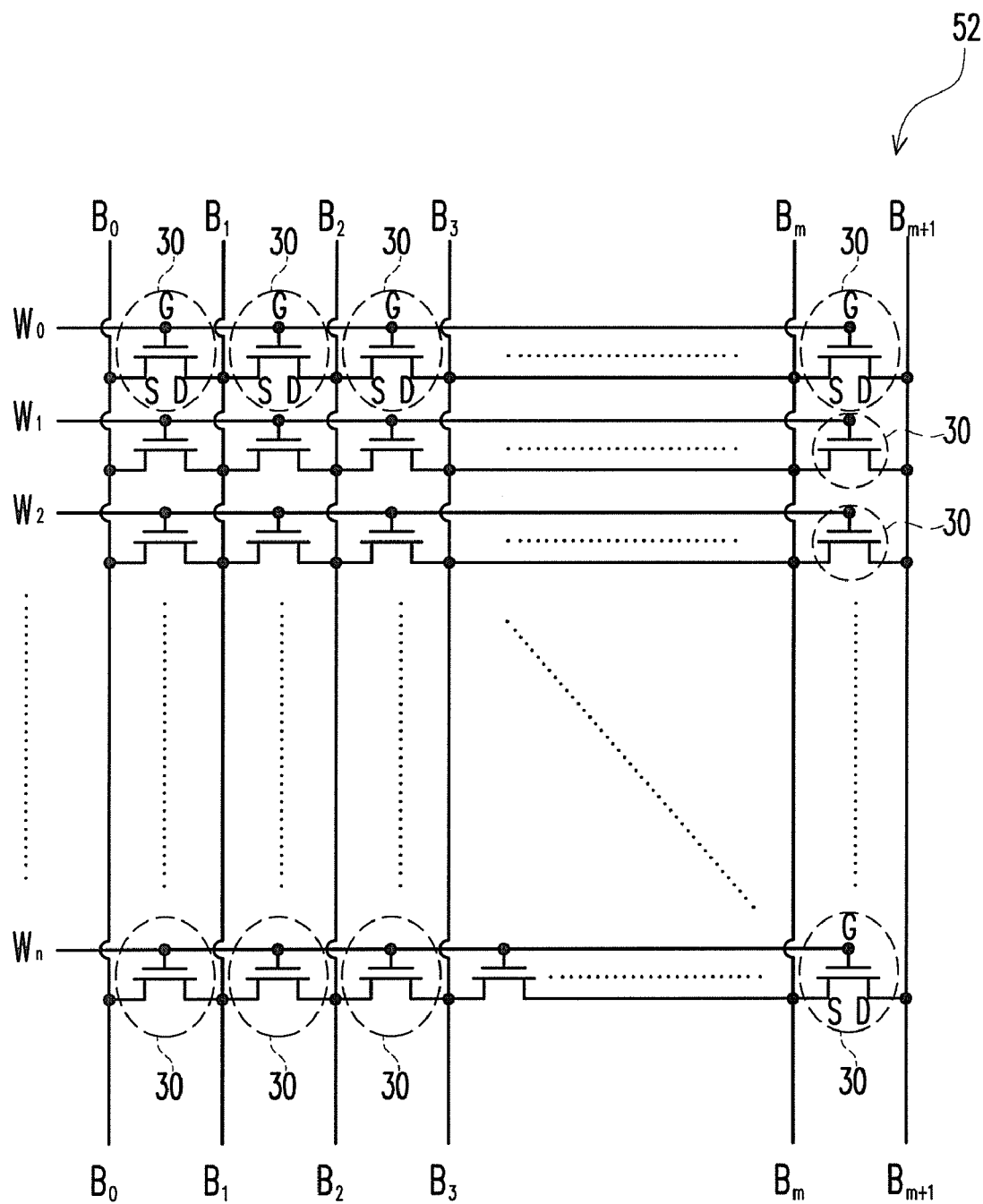
FIG. 5 is a circuit diagram of a memory of the memory apparatus shown in FIG. 4.

Please refer to FIGS. 4 and 5. FIG. 4 is a functional block diagram of a memory apparatus 50 according to an embodiment of the present invention, and FIG. 5 is a circuit diagram of a memory 52 of the memory apparatus 50. The memory apparatus 50 has the memory 52, a controller 54, a row decoder 56, a column decoder 58, and a sense circuit 60. The memory 52 has a plurality of the memory cells 30 in FIG. 3. The memory cells 30 of the memory 52 are arranged in an array with n rows and m columns, where n and m are integers greater than 1. The controller 54 is coupled to the row decoder 56 and the column decoder 58 to control the operations of the memory cells 30 of the memory 52. The row decoder 56 applies world line voltages to the gates 44 of the memory cells 30 via a plurality of word lines $W_0$-$W_n$ of the memory apparatus 50. The column decoder 58 applies bit line voltages to the memory cells 30 via a plurality of bit lines $B_0$-$B_{m+1}$ of the memory apparatus 50. Referring to FIGS. 3 and 5, the gate 44 of each of the memory cells 30 is coupled to a corresponding one of the word lines $W_0$-$W_n$. The source 34 and the drain 36 of each of the memory cells 30 are coupled to two adjacent ones of the bit lines $B_0$-$B_{m+1}$. For example, the gate of the most left-top memory cell 30 is coupled to the word line $W_0$, and the source and drain of the most left-top memory cell 30 are coupled to the bit lines $B_0$ and $B_1$ respectively. In the embodiment, when programming one side of one of the memory cells 30, the gate of the memory cell 30 is applied with a first word-line voltage (e.g. 10V) via a corresponding one of the word lines $W_0$-$W_n$, the source/drain near the side under programming operation is applied with a first bit-line voltage (e.g. 4V) via a corresponding one of the bit lines $B_0$-$B_{m+1}$, and the source/drain near the other side of the memory cell 30 is grounded. Referring to FIG. 3, when programming the first side 41, the gate 44 is applied with the first word-line voltage, the source 34 is applied with the first bit-line voltage, and the drain 36 is grounded. Additionally, when programming the second side 43, the gate 44 is also applied with the first word-line voltage, the source 34 is grounded, and the drain 36 is applied with the first bit-line voltage. The programming operation for the memory cell 30 would continue until the threshold voltage of the side under programming operation is higher than or equal to a predetermined level.

Moreover, when reading data from the one side of a memory cell 30, the gate of the memory cell 30 is applied with a second word-line voltage (e.g. 5V) via a corresponding one of the word lines $W_0$-$W_n$, the source/drain near the side under reading operation is grounded, and the source/drain near the other side is applied with a second bit-line voltage (e.g. 1.6V) via a corresponding one of the bit lines $B_0$-$B_{m+1}$. Referring to FIG. 3, when reading the bit of the first side 41 of the memory cell 30, the gate 44 is applied with the second word-line voltage, the source 34 is grounded, and the drain 36 is applied with the second bit-line voltage. If the second word-line voltage is higher than the threshold voltage of the first side 41, the channel between the source 34 and the drain 36 is turned on, and a current flows from the drain 36 through the source 34 and a corresponding one of the bit lines $B_0$-$B_{m+1}$ to the sense circuit 60. However, if the second word-line voltage is less than the threshold voltage of the first side 41, the channel between the source 34 and the drain 36 is turned off, and the sense circuit 60 senses no current from the memory cell 30. Therefore, the sense circuit 60 could determine which logic state of the bit of first side 41 by detecting the current from the memory 30. Similarly, when reading the bit of the second side 43 of the memory cell 30, the gate 44 is applied with the second word-line voltage, the source 34 is applied with the second bit-line voltage, and the drain 36 is grounded. If the second word-line voltage is higher than the threshold voltage of the second side 43, the channel between the source 34 and the drain 36 is turned on, and a current flows from the source 34 through the drain 36 and a corresponding one of the bit lines $B_0$-$B_{m+1}$ to the sense circuit 60. However, if the second word-line voltage is less than the threshold voltage of the second side 43, the channel between the source 34 and the drain 36 is turned off, and the sense circuit 60 senses no current from the memory cell 30.

Figure 1:
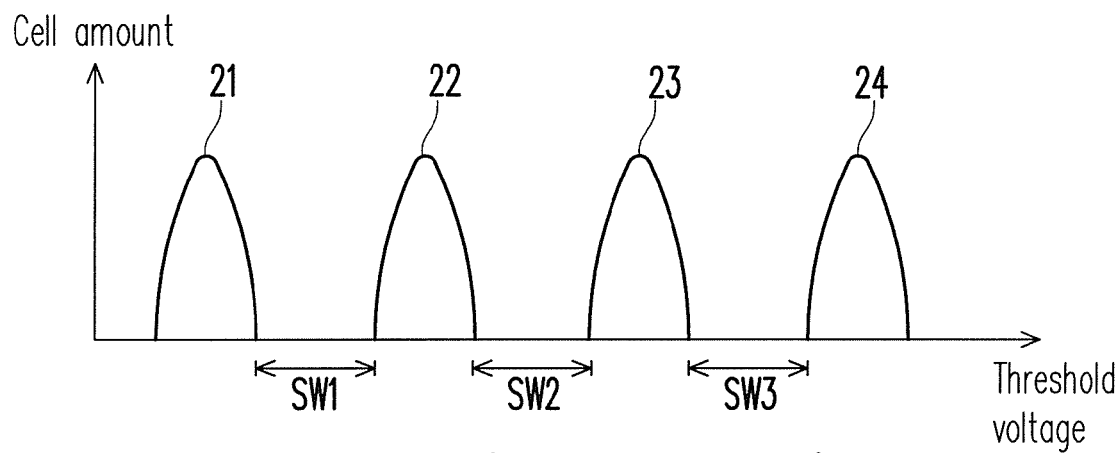
FIG. 1 is example of threshold voltage distribution diagram of a conventional 1-Megabyte memory.
Figure 2:
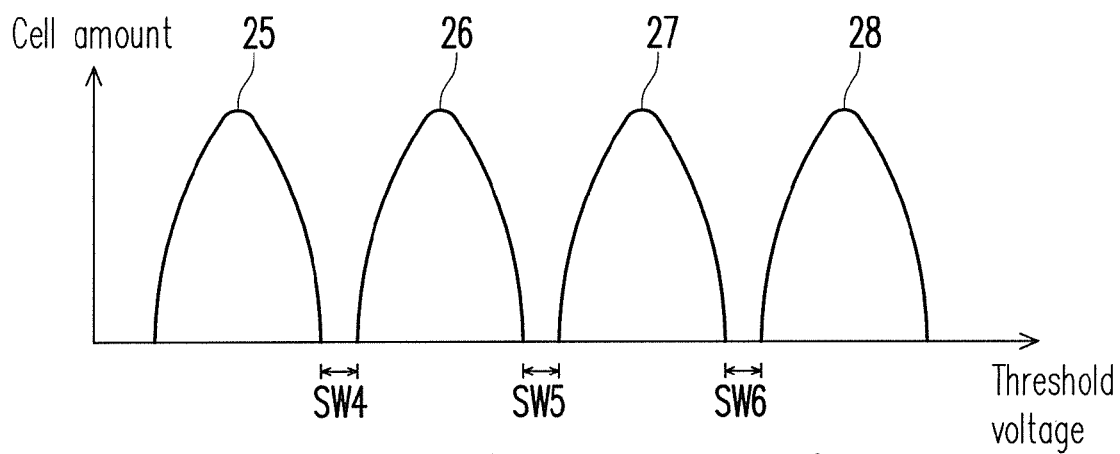
FIG. 2 is example of threshold voltage distribution diagram of a conventional 1-Gigabyte memory.
Figure 6:
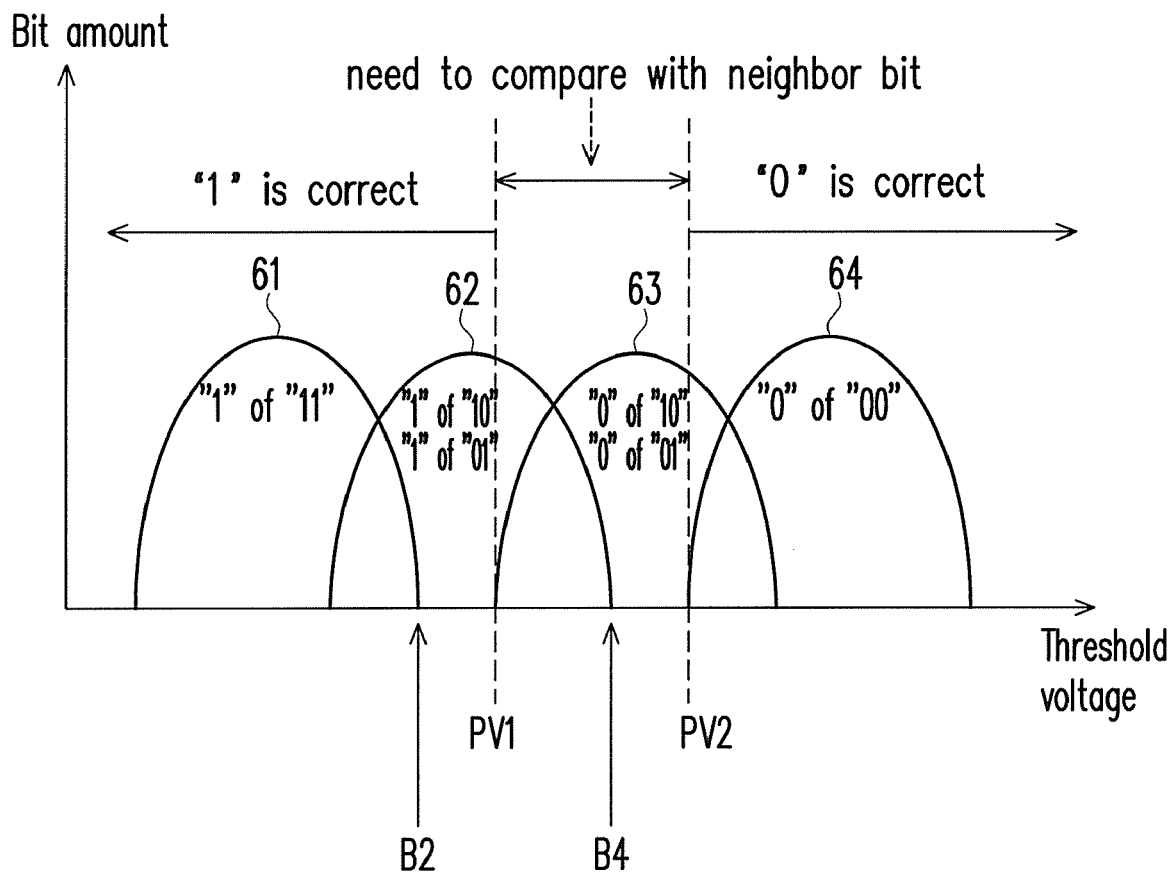
FIG. 6 is a diagram shows threshold voltage distributions of the memory cells of the memory when the memory cells have been programmed according to an embodiment of the present invention.

Please refer to FIG. 6, which is a diagram shows threshold voltage distributions of the memory cells 30 of the memory 50 when the memory cells 30 have been programmed according to an embodiment of the present invention. Different from the threshold voltage distribution diagrams shown in FIGS. 1 and 2, the horizontal axis in FIG. 6 represents the threshold voltage of each of the sides 41 and 43 of the memory cells 30, and the vertical axis represents the amount of the bits that are stored by the sides 41 and 43 of the memory cells 30. FIG. 6 illustrates a first threshold voltage distribution 61, a second threshold voltage distribution 62, a third threshold voltage distribution 63, and a fourth threshold voltage distribution 64. The first threshold voltage distribution 61 indicates the distribution of threshold voltages of the bits "1" of the memory cells 30 with a "11" pattern. The second threshold voltage distribution 62 indicates the distribution of threshold voltages of the bits "1" of the memory cells 30 with "01" and "10" patterns. The third threshold voltage distribution 63 indicates the distribution of threshold voltages of the bits "0" of the memory cells 30 with the "01" and "10" patterns. The fourth threshold voltage distribution 64 indicates the distribution of threshold voltages of the bits "0" of the memory cells 30 with a "00" pattern. The patterns "11", "01", "10", and "00" are used to indicate which data that the memory cells 30 stores. For example, a memory cell 30 with the "11" pattern means that the memory cell 30 stores two bits of "11", and a memory cell 30 with the "01" pattern means that the memory cell 30 stores two bits of "01", etc. In more detail, the most significant bit (MSB) of each pattern represents the data that the first side 41 of the corresponding memory cell 30 stores, and the least significant bit (LSB) of each pattern represents the data that the second side 43 of the corresponding memory cell 30 stores. For example, the first side 41 of a memory cell 30 with the pattern "01" stores one bit "0" of data, and the second side 43 of the memory cell 30 with the pattern "01" stores one bit "1" of data.

Figure 7:
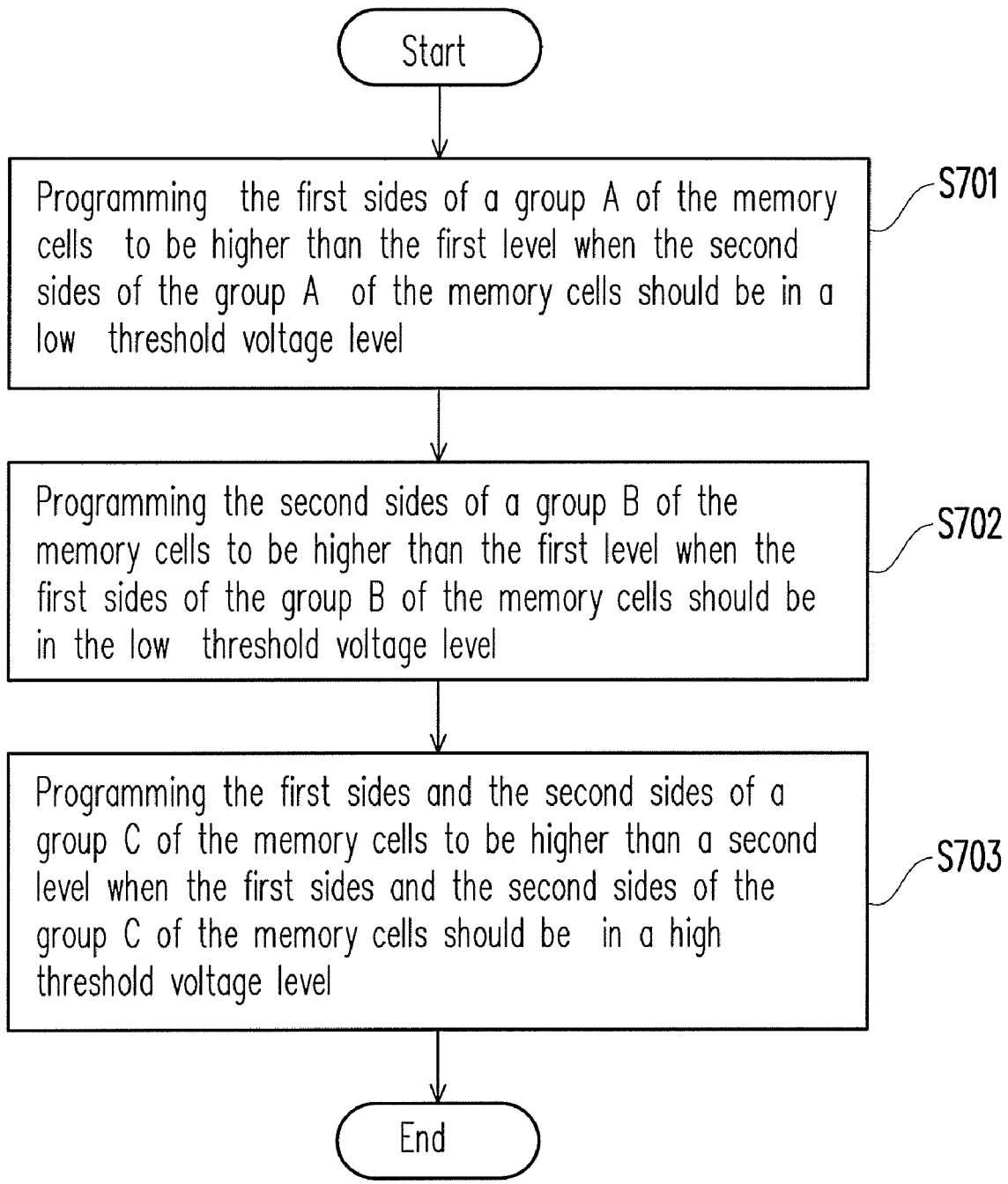
FIG. 7 is flow chart when the controller in FIG. 4 programs the memory cells of the memory.

As shown in FIG. 6, the first threshold voltage distribution 61 has an upper bound B2, and the second threshold voltage distribution 62 has an upper bound B4. The upper bound B2 is an initial upper bound of the memory cells 30 when all of the memory cells are not programmed. The upper bound B4 is the word line voltage that could be used to correctly distinguish all of the bits of logic "1". The upper bound B4 is higher than the upper bound B2. The upper bound B2 and B4 could be accurately found by measuring the threshold voltages of the memory cells 30. Additionally, the lower bound of the third threshold voltage distribution 63 is equal to or higher than a first level PV1, and the lower bound of the fourth threshold voltage distribution 64 is equal to or higher than a second level PV2. The first level PV1 is defined to be higher than the upper bound B2, and the second level PV2 is defined to be higher than the upper bound B4. Please refer to FIG. 7 with the reference of FIGS. 4-6. FIG. 7 is flow chart when the controller 54 programs the memory cells 30 of the memory 52. For simplicity's sake, FIG. 6 is used to illustrate the threshold voltage distributions of the programmed memory cells 30 after the memory cells 30 are programmed by the controller 30. When programming the memory cells 30, the first sides 41 of a group A of the memory cells 30 are programmed to be higher than the first level PV1 if the second sides 43 of the group A of the memory cells 30 should be in a low threshold voltage level (Step S701). The group A of the memory cells 30 recited here means the memory cells 30 would be programmed to be "01". Moreover, when programming the memory cells 30, the second sides 43 of a group B of the memory cells 30 are programmed to be higher than the first level PV1 if the first sides 41 of the group B of the memory cells 30 should be in the low threshold voltage level (Step S702). The group B of the memory cells 30 recited here means the memory cells 30 would be programmed to be "10". Furthermore, when programming the memory cells 30, the first sides 41 and the second sides 43 of a group C of the memory cells 30 are programmed to be higher than the second level PV2 if the first sides 41 and the second sides 43 of the group C of the memory cells should be in a high threshold voltage level (Step S703). The group C of the memory cells 30 recited here means the memory cells 30 would be programmed to be "00". Any first side 41 or second side 43 should be in the low threshold voltage level means that the bit of the first side 41 or the second side 43 should be "1" after the programming operations of the memory 52, and any first side 41 or second side 43 should be in the high threshold voltage level means that the bit of the first side 41 or the second side 43 should be "0" after the programming operations of the memory 52. Because of the second bit effects of the memory cells 30, when programming the first sides 41 to be "0" and un-programming the second sides 43, the threshold voltages of the un-programmed second sides 43 would be increased. Similarly, when programming the second sides 43 to be "0" and un-programming the first sides 41, the threshold voltages of the unprogrammed first sides 41 would be increased. As shown in FIG. 6, the second threshold voltage distribution 62 is shifted right from the first threshold voltage distribution 61. In other words, the averaged threshold voltage of the bit "1" of the second threshold voltage distribution 63 is greater than the averaged threshold voltage of the bit "1" of the first threshold voltage distribution 61. In the document, the group A may also be termed as a first group, the group C may also be termed as a second group, and the group B may also be termed as a third group.

Please refer to FIG. 7 again. The execution sequences of the steps S701, S702 and S703 could be altered. For example, the step S702 or S703 could be executed before the execution of the step S701. Moreover, according to an embodiment of the present invention, before programming the first sides 41 and the second sides 43 of the group C of the memory cells 30 to be higher than the second level PV2, the first sides 41 and the second sides 43 of the group C of the memory cells 30 and the first sides 41 of the group A of the memory cells 30 are programmed to be higher than the first level PV1 simultaneously. In other words, the controller 54 controls the row decoder 56 and the column decoder 58 to program the first sides 41 of the groups A and C of the memory cells 30 to be higher than the first level PV1, and then to program the second sides 43 of the group C of the memory 30 to be higher than the second level PV2 while the operation for programming the first sides 41 of the group A is stopped. Therefore, the total programming time of the memory cells 30 would be reduced.

In addition, according to an embodiment of the present invention, before programming the first sides 41 and the second sides 43 of the group C of the memory cells 30 to be higher than the second level PV2, the first sides 41 and the second sides 43 of the group C of the memory cells 30 and the second sides 43 of the group A of the memory cells 30 are programmed to be higher than the first level PV1 simultaneously. In other words, the controller 54 controls the row decoder 56 and the column decoder 58 to program the second sides 43 of the groups A and C of the memory cells 30 to be higher than the first level PV1, and then to program the first sides 41 of the group C of the memory 30 to be higher than the second level PV2 while the operation for programming the second sides 43 of the group A is stopped.

In another embodiment of the present invention, when programming the first sides 41 of the group A of the memory cells 30 to be higher than the first level PV1 in the step S701, it would be determined whether the threshold voltages of the second sides 43 of the first group A of the memory cells 30 are higher than the first level PV1. Since the threshold voltages of the second sides 43 of the first group A should be less than the threshold voltages of the first sides 41 of the first group A, if the threshold voltages of the second sides 43 of the first group A of the memory cells are higher than the first level PV1 due to the second bit effects, it could be verified that the first sides 41 of the group A of the memory cells 30 have been programmed to be higher than the first level PV1. Therefore, when threshold voltages of the second sides 43 of the first group A of the memory cells 30 are higher than the first level PV1, the step S701 is terminated to stop programming the first sides 41 of the first group A of the memory cells 30. Similarly, when programming the second sides 43 of the group B of the memory cells 30 to be higher than the first level PV1 in the step S702, it would be determined whether the threshold voltages of the first sides 41 of the second group B of the memory cells 30 are higher than the first level PV1. Since the threshold voltages of the first sides 41 of the second group B should be less than the threshold voltages of the second sides 43 of the second group B, if the threshold voltages of the first sides 41 of the second group B of the memory cells are higher than the first level PV1 due to the second bit effects, it could be verified that the second sides 43 of the second group B of the memory cells 30 have been programmed to be higher than the first level PV1. Therefore, when threshold voltages of the first sides 41 of the second group B of the memory cells 30 are higher than the first level PV1, the step S702 is terminated to stop programming the second sides 43 of the second group B of the memory cells 30.

Figure 8:
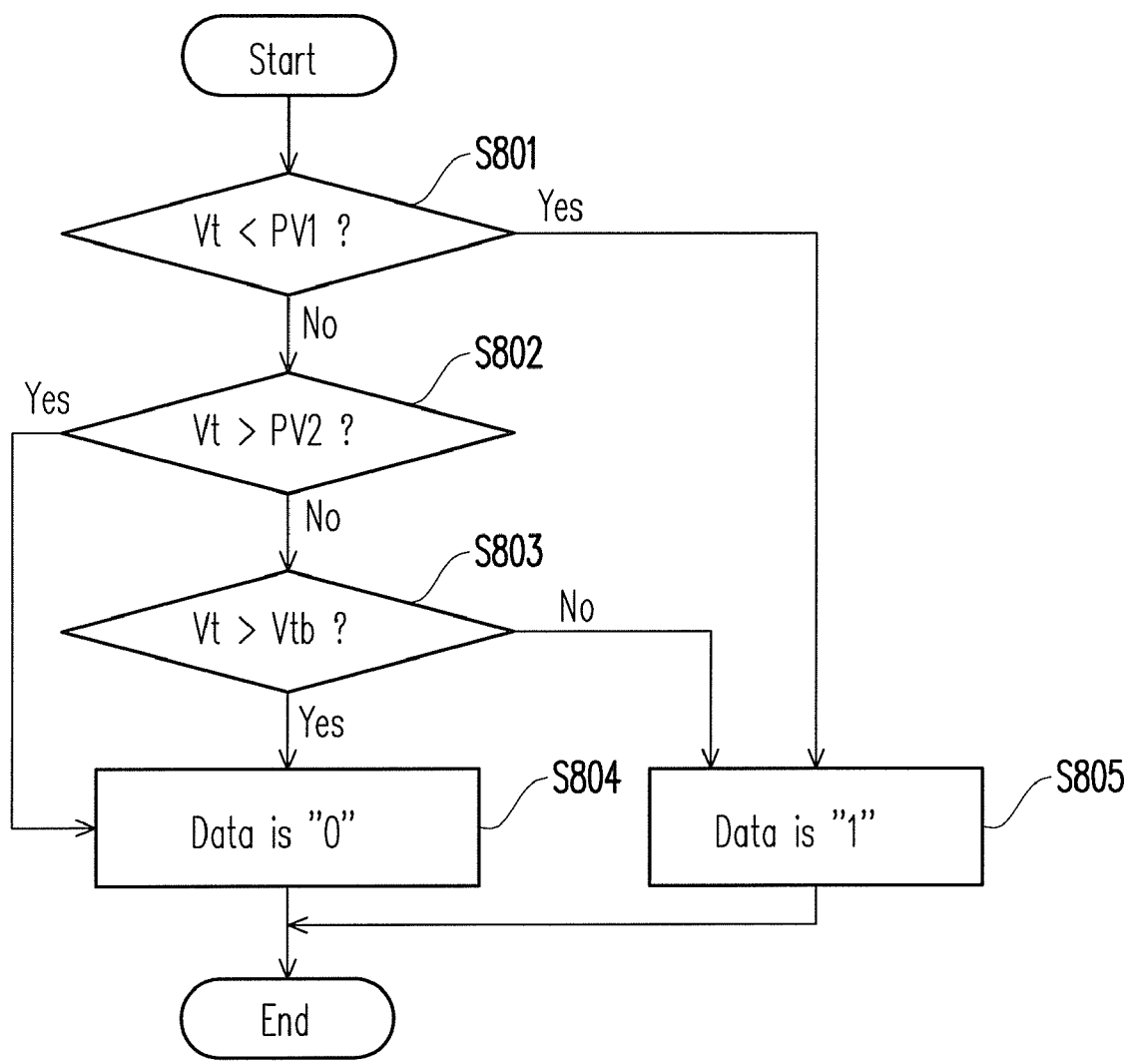
FIG. 8 is a flow chart when the controller in FIG. 4 reads data from the memory cells of the memory.

Please refer to FIG. 8 with the reference of FIGS. 3-6. FIG. 8 is a flow chart when the controller 54 reads data from the memory cells 30 of the memory 52. When reading data from the memory cells 30, the row decoder 56 applies a word line voltage of PV1 to the gates of the memory cells 30 via the word lines $W_0$-$W_n$. Since the word line voltage of PV1 is higher than the upper bound B2, the channels of the memory cell with the pattern "11" would be turned on, such that the bit of each side of the memory cells 30 with the pattern "11" could be read out. In other words, all bits of the first threshold voltage distribution 61 could be correctly distinguished to be the logic "1". Additionally, since the lower bound of the third threshold voltage distribution 63 is equal to or higher than a first level PV1, no bit of logic "0" would be erroneously determined to be the logic "1". Therefore, when reading data of the memory cells 30 by applying the word line voltage of PV1, all of the read-out bits of logic "1" are correct. Based on the foregoing description, the controller 54 would determine whether the threshold voltage (i.e. Vt) of the side under reading operation is less than the first level PV1 (Step S801). If the threshold voltage Vt of the side under reading operation is lower than the first level PV1, the bit of the side under reading operation is determined to the logic state "1" (Step S805).

Additionally, when reading data from the memory cells 30, the row decoder 56 applies another word line voltage of PV2 to the target memory cells 30. Since the word line voltage of PV2 is higher than the upper bound B4, all bits of the memory cells 30 with the pattern "00" could be read out. In other words, all bits of the fourth threshold voltage distribution 64 could be correctly distinguished to be "0". Moreover, since the second level PV2 is higher than the upper bound B4 of the second threshold voltage distribution 62, no bit of logic "1" would be erroneously determined to be the logic "0". Therefore, when reading data of the memory cells 30 by applying the word line voltage of PV2, all of the read-out bits of logic "0" are correct. The controller 54 would determine whether the threshold voltage Vt of the side under reading operation is higher than the second level PV2 (Step S802). If the threshold voltage Vt of the side under reading operation is higher than the second level PV2, the bit of the side under reading operation is determined to the logic state "0" (Step S804).

When the threshold voltage Vt of the side under reading operation is between the first level PV1 and the second level PV2, it means that the data pattern of the memory cell 30 should be "01" or "10". In such case, the controller 54 would compares the threshold voltage Vt of the side under reading operation with the threshold voltage Vtb of the neighbor side in the same memory cell 30 (Step S803). If the threshold voltage Vt is greater than the threshold voltage Vtb, the bit of the side under reading operation could be distinguished to be "0" (Step S804), and the other side in the same memory cell 30 could be distinguished to be "1". However, if the threshold voltage Vt is less than the threshold voltage Vtb, the bit of the side under reading operation could be distinguished to be "1" (Step S805), and the other side in the same memory cell 30 could be distinguished to be "0". It should be noted that the execution sequences of steps S801 and S802 could be altered. In an embodiment of the present invention, the step S802 is executed before the execution of the step S801.

In summary, the controller of the present invention programs the first sides and the second sides of the memory cells to different levels. Several threshold voltage distributions of the programmed memory cells could be overlapped with each other, such that the threshold voltage range could be shorten so as to increase the speed for programming the memory cells. When reading data from the memory cells, the controller distinguishes the bits of the memory cells by comparing the threshold voltages of the memory cells with the different levels and by comparing the threshold voltages with those of neighbor programmable sides.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed:

1. A method for operating a memory, the memory comprising a plurality of memory cells, each of the memory cells having a first side and a second side, the method comprising:
   programming the first sides of a first group of the memory cells to be higher than a first level when the second sides of the first group of the memory cells should be in a low threshold voltage level;
   programming the first sides and the second sides of a second group of the memory cells to be higher than a second level when the first sides and the second sides of the second group of the memory cells should be in a high threshold voltage level, wherein the first level is less than the second level; and
   stopping programming the first sides of the first group of the memory cells when threshold voltages of the second sides of the first group of the memory cells are higher than the first level.

2. The method as claimed in claim 1 further comprising:
   programming the second sides of a third group of the memory cells to be higher than the first level when the first sides of the third group of the memory cells should be in the low threshold voltage level.

3. The method as claimed in claim 1, wherein before programming the first sides and the second sides of the second group of the memory cells to be higher than the second level, the first sides and the second sides of the second group of the memory cells and the first sides of the first group of the memory cells are programmed to be higher than the first level simultaneously.

4. The method as claimed in claim 1 further comprising:
   finding an upper bound of a first threshold voltage distribution of the memory; and
   defining the first level to be higher than the upper bound of the first distribution.

5. The method as claimed in claim 4 further comprising:
   finding an upper bound of a second threshold voltage distribution of the memory; and
   defining the second level to be higher than the upper bound of the second distribution;
   wherein the upper bound of the second threshold voltage distribution is higher than the upper bound of the first threshold voltage distribution.

6. A method for operating a memory, the memory comprising at least one memory cell, the memory cell having a first side and a second side, the method comprising:
   determining whether a threshold voltage of the first side of the memory cell is higher than a first level;
   determining whether the threshold voltage of the first side of the memory cell is less than a second level, wherein the first level is less than the second level; and
   comparing the threshold voltage of the first side with a threshold voltage of the second side when the threshold voltage of the first side is between the first level and the second level.

7. The method as claimed in claim 6 further comprising:
   if the threshold voltage of the first side of the memory cell is less than then the first level, determining the first side to be a first logic state.

8. The method as claimed in claim 6 further comprising:
   if the threshold voltage of the first side of the memory cell is higher than then the second level, determining the first side to be a second logic state.

9. The method as claimed in claim 6 further comprising:
   if the threshold voltage of the first side is between the first level and the second level and if the threshold voltage of the first side is less than the threshold voltage of the second side, determining the first side to be a first logic state and the second side to be a second logic state.

10. The method as claimed in claim 6 further comprising:
    if the threshold voltage of the first side is between the first level and the second level and if the threshold voltage of the first side is higher than the threshold voltage of the second side, determining the first side to be a second logic state and the second side to be a first logic state.

11. A memory apparatus, comprising:
a memory having a plurality of memory cells, each of the memory cells having a first side and a second side; and
a controller for applying at least following steps to program the memory cells:
programming the first sides of a first group of the memory cells to be higher than a first level when the second sides of the first group of the memory cells should be in a low threshold voltage level; and
programming the first sides and the second sides of a second group of the memory cells to be higher than a second level when the first sides and the second sides of the second group of the memory cells should be in a high threshold voltage level, wherein the first level is less than the second level.

12. The memory apparatus as claimed in claim 11, wherein the controller further applies following step to program the memory cells:
stopping programming the first sides of the first group of the memory cells when threshold voltages of the second sides of the first group of the memory cells are higher than the first level.

13. The memory apparatus as claimed in claim 11, wherein the controller further applies following step to program the memory cells:
programming the second sides of a third group of the memory cells to be higher than the first level when the first sides of the third group of the memory cells should be in the low threshold voltage level.

14. The memory apparatus as claimed in claim 11, wherein before programming the first sides and the second sides of the second group of the memory cells to be higher than the second level, the controller simultaneously programs the first sides and the second sides of the second group of the memory cells and the first sides of the first group of the memory cells to be higher than the first level.

15. The memory apparatus as claimed in claim 11, wherein the controller further applies following steps to program the memory cells:
finding an upper bound of a first threshold voltage distribution of the memory; and
defining the first level to be higher than the upper bound of the first distribution.

16. The memory apparatus as claimed in claim 15, wherein the controller further applies following steps to program the memory cells:
finding an upper bound of a second threshold voltage distribution of the memory; and
defining the second level to be higher than the upper bound of the second distribution;
wherein the upper bound of the second threshold voltage distribution is higher than the upper bound of the first threshold voltage distribution.

17. A memory apparatus, comprising:
a memory having at least one memory cell, the memory cell having a first side and a second side; and
a controller for applying at least following steps to read the memory cell:
determining whether a threshold voltage of the first side of the memory cell is higher than a first level;
determining whether the threshold voltage of the first side of the memory cell is less than a second level, wherein the first level is less than the second level; and
comparing the threshold voltage of the first side with a threshold voltage of the second side when the threshold voltage of the first side is between the first level and the second level.

18. The memory apparatus as claimed in claim 17, wherein the controller further applies following step to read the memory cell:
if the threshold voltage of the first side of the memory cell is less than then the first level, determining the first side to be a first logic state.

19. The memory apparatus as claimed in claim 17, wherein the controller further applies following step to read the memory cell:
if the threshold voltage of the first side of the memory cell is higher than then the second level, determining the first side to be a second logic state.

20. The memory apparatus as claimed in claim 17, wherein the controller further applies following step to read the memory cell:
if the threshold voltage of the first side is between the first level and the second level and if the threshold voltage of the first side is less than the threshold voltage of the second side, determining the first side to be a first logic state and the second side to be a second logic state.

21. The memory apparatus as claimed in claim 17, wherein the controller further applies following step to read the memory cell:
if the threshold voltage of the first side is between the first level and the second level and if the threshold voltage of the first side is higher than the threshold voltage of the second side, determining the first side to be a second logic state and the second side to be a first logic state.

* * * * *